United States Patent
Sato et al.

(10) Patent No.: US 8,426,830 B2
(45) Date of Patent: Apr. 23, 2013

(54) FOCUSED ION BEAM APPARATUS, SAMPLE PROCESSING METHOD USING THE SAME, AND COMPUTER PROGRAM FOR FOCUSED ION BEAM PROCESSING

(75) Inventors: Makoto Sato, Chiba (JP); Masahiro Kiyohara, Chiba (JP); Junichi Tashiro, Chiba (JP)

(73) Assignee: SII Nano Technology Inc., Chiba (JP)

( * ) Notice: Subject to any disclaimer, the term of this patent is extended or adjusted under 35 U.S.C. 154(b) by 741 days.

(21) Appl. No.: 12/613,107

(22) Filed: Nov. 5, 2009

(65) Prior Publication Data

US 2010/0155624 A1    Jun. 24, 2010

(30) Foreign Application Priority Data

Dec. 18, 2008    (JP) .................................. 2008-321821

(51) Int. Cl.
*G21G 4/00*        (2006.01)
(52) U.S. Cl.
USPC ................... 250/492.1; 250/492.2; 250/492.3
(58) Field of Classification Search ..... 250/492.1–492.3
See application file for complete search history.

(56) References Cited

U.S. PATENT DOCUMENTS

2007/0284538 A1*  12/2007  Zani et al. ..................... 250/398
2008/0078947 A1*  4/2008   Horiuchi et al. ........... 250/492.2

FOREIGN PATENT DOCUMENTS

| JP | 03-166744   | A | 7/1991  |
| JP | 10-162766   | A | 6/1998  |
| JP | 2007-109560 | A | 4/2007  |
| JP | 2007109560  | * | 4/2007  |
| JP | 2007-123164 | A | 5/2007  |
| JP | 2008-270025 |   | 11/2008 |

* cited by examiner

*Primary Examiner* — Michael Maskell
(74) *Attorney, Agent, or Firm* — Brinks Hofer Gilson & Lione

(57) ABSTRACT

A focused ion beam apparatus includes: a focused ion beam irradiating mechanism configured to irradiate a sample with a focused ion beam; a detector configured to detect a secondary charged particle generated by irradiating the sample with the focused beam; an image generating unit configured to generate an sample image of the sample; a processing area setting unit configured to set a processing area image including a plurality of pixels corresponding to positions of irradiation of the focused ion beam on the sample image; a position of irradiation setting unit configured to set coordinates of the pixels included in the processing area image; a beam setting unit configured to set a dose amount of the focused ion beam irradiated from the focused ion beam irradiating mechanism according to intensities; and an interpolating unit configured to perform an interpolating process on the processing area image.

7 Claims, 4 Drawing Sheets

FOCUSED ION BEAM APPARATUS, SAMPLE PROCESSING METHOD USING THE SAME, AND COMPUTER PROGRAM FOR FOCUSED ION BEAM PROCESSING

RELATED APPLICATIONS

This application claims priority under 35 U.S.C. §119 to Japanese Patent Application No. 2008-321821 filed on Dec. 18, 2008, the entire content of which is hereby incorporated by reference.

BACKGROUND OF THE INVENTION

1. Field of the Invention

The present invention relates to a focused ion beam apparatus configured to process a sample with a focused ion beam, a sample processing method using the same, and a computer program for focused ion beam processing.

2. Description of the Related Art

In the related art, the focused ion beam apparatus has been used for etching a semiconductor device, for example, and obtaining a cross section for observation, or for slicing the sample into a thin piece and fabricating a sample piece for a transmission electron microscope (Japanese Patent No. 2973211). In recent years, there arise needs for processing the sample into complex shapes such as a lens shape or a solder ball shape using the focused ion beam apparatus.

The processing with the focused ion beam is performed by specifying a portion to be irradiated with the focused ion beam (processing area) by a pointing device or the like on a sample image (JP-A-2008-270025).

In contrast, in order to process the complex shapes having curved lines or curved surfaces efficiently by the focused ion beam, it is necessary to set the processing area into an arbitrary shape instead of simple linear shapes or rectangular shapes.

Therefore, a method of storing image data (bitmap data) of various shapes in a control unit of the focused ion beam apparatus in advance, specifying desired image data as the processing area, and irradiating with a beam along the complex shape of the image data is employed.

This technique allows processing of the complex shapes along the image data by reading pixel coordinates included in the image data specified on a sample image (processing area) on the control side, and irradiating each pixel with the focused ion beam.

When setting the processing area on the basis of the image data and irradiating the same with the beam, there is a case in which scaling (deformation) of the processing area is desired. For example, when an upper half of the processing area has a protruding shape and a lower half of the same has a substantially flat shape, if only the protruded upper half can be etched intensively in a stage after a predetermined processing is proceeded, the processing speed or the processing efficiency is improved. Also, by changing the size of the processing area in the course of processing, etching pits having different diameters in the direction vertical to the direction of irradiation of the beam are obtained.

However, when the image data including the pixels are reduced in scale on the sample image, the number of pixels is reduced according to the ratio of scale reduction of the image data, and hence the image data is deteriorated in finesse of resolution. In this case, since the position to be irradiated with the focused ion beam is reduced, the processing area of the image data after reduction in scale cannot reproduce the shape of original image data. When the image data is enlarged in scale, the number of pixels is increased, but the image may be deteriorated and the shape of the original image data cannot be reproduced unless intensities of the pixels are set adequately.

SUMMARY OF THE INVENTION

In order to solve the problems described above, it is an object of the invention to provide a focused ion beam apparatus which is able to perform a processing which achieves reproduction of an original image even though an processing area image including a plurality of pixels is deformed, a sample processing method using the same, and a computer program for focused ion beam processing.

In order to achieve the object described above, the invention provides a focused ion beam apparatus comprising: a sample stage configured to place a sample thereon and provided with a moving mechanism configured to move the position of the sample; a focused ion beam irradiating mechanism configured to irradiate the sample with a focused ion beam; a detector configured to detect a secondary charged particle generated from the sample when being irradiated with the focused ion beam or other electron beams; an image generating unit configured to generate a sample image of the sample on the basis of the detected data detected by the detector; a display unit configured to display the sample image; a processing area setting unit configured to set a processing area image including a plurality of pixels corresponding to positions to be irradiated with the focused ion beam on the sample image displayed on the display unit; a position of irradiation setting unit configured to set coordinates of the pixels included in the processing area image as the position to be irradiated on the sample; a beam setting unit configured to set a dose amount of the focused ion beam irradiated from the focused ion beam irradiating mechanism according to intensities predetermined on the pixel-to-pixel basis; and an interpolating unit configured to perform an interpolating process on the processing area image when the processing area image is deformed by the processing area setting unit.

In this configuration, since the change of the intensity of the pixel is smoothened by the interpolating process even when the processing area image is deformed, the changes of the dose amounts (that is, the change of the degree of the processing) of the ion beam according to the intensities are also smoothened before and after the deformation, so that the processing which reproduces the original image is achieved.

Also, when the processing area image is deformed during the irradiation of the ion beam, pits having different diameters in the direction vertical to the direction of irradiation of the ion beam (in the case of etching) or deposits (in the case of deposition) having different diameters may be formed.

In addition, a binarizing unit configured to binarize the intensities of the respective pixels is provided, and a dose amount setting unit may either be irradiated with the focused ion beam by a constant dose amount or may not irradiate the focused ion beam depending on the binarized intensities.

In this configuration, the dose amount of the ion beam becomes constant and the degree of processing also becomes constant. However, the load of processing of the control unit is alleviated, and the processing time can be reduced.

The processing of the sample via the irradiation of the focused ion beam is etching of the sample or deposition on the sample.

There is also provided a method of processing a sample by irradiating the sample with a focused ion beam using a focused ion beam apparatus according to the invention including: setting a processing area image including a plurality of pixels corresponding to positions to be irradiated with the focused ion beam on the sample image of the sample; setting coordinates of the pixels included in the processing area image as the position to be irradiated on the sample; setting a dose amount of the focused ion beam irradiated from the focused ion beam irradiating mechanism according to intensities predetermined on the pixel-to-pixel basis; and performing an interpolating process on the processing area image when the processing area image is deformed.

There is also provided a process of binarizing the intensities of the respective pixels, and the beam setting unit irradiates the focused ion beam by the constant dose amount, or does not irradiate the focused ion beam according to the binarized intensities when setting the dose amount.

Preferably, the processing of the sample via the irradiation of the focused ion beam is etching of the sample or deposition on the sample.

There is also provided a computer program configured to perform a processing by irradiating a sample with a focused ion beam using a focused ion beam apparatus, the computer program causing a computer to execute a process including: setting a processing area image including a plurality of pixels corresponding to positions to be irradiated with the focused ion beam on the sample image of the sample; setting coordinates of the pixels included in the processing area image as the position to be irradiated on the sample; setting a dose amount of the focused ion beam irradiated from the focused ion beam irradiating mechanism according to intensities predetermined on the pixel-to-pixel basis; and performing an interpolating process on the processing area image when the processing area image is deformed by the processing area setting unit.

According to the invention, the processing in which the original image is reproduced is achieved even when the processing area image including a plurality of pixels are deformed at the time of processing with the focused ion beam apparatus.

DETAILED DESCRIPTION OF THE PREFERRED EMBODIMENTS

Figure 1:
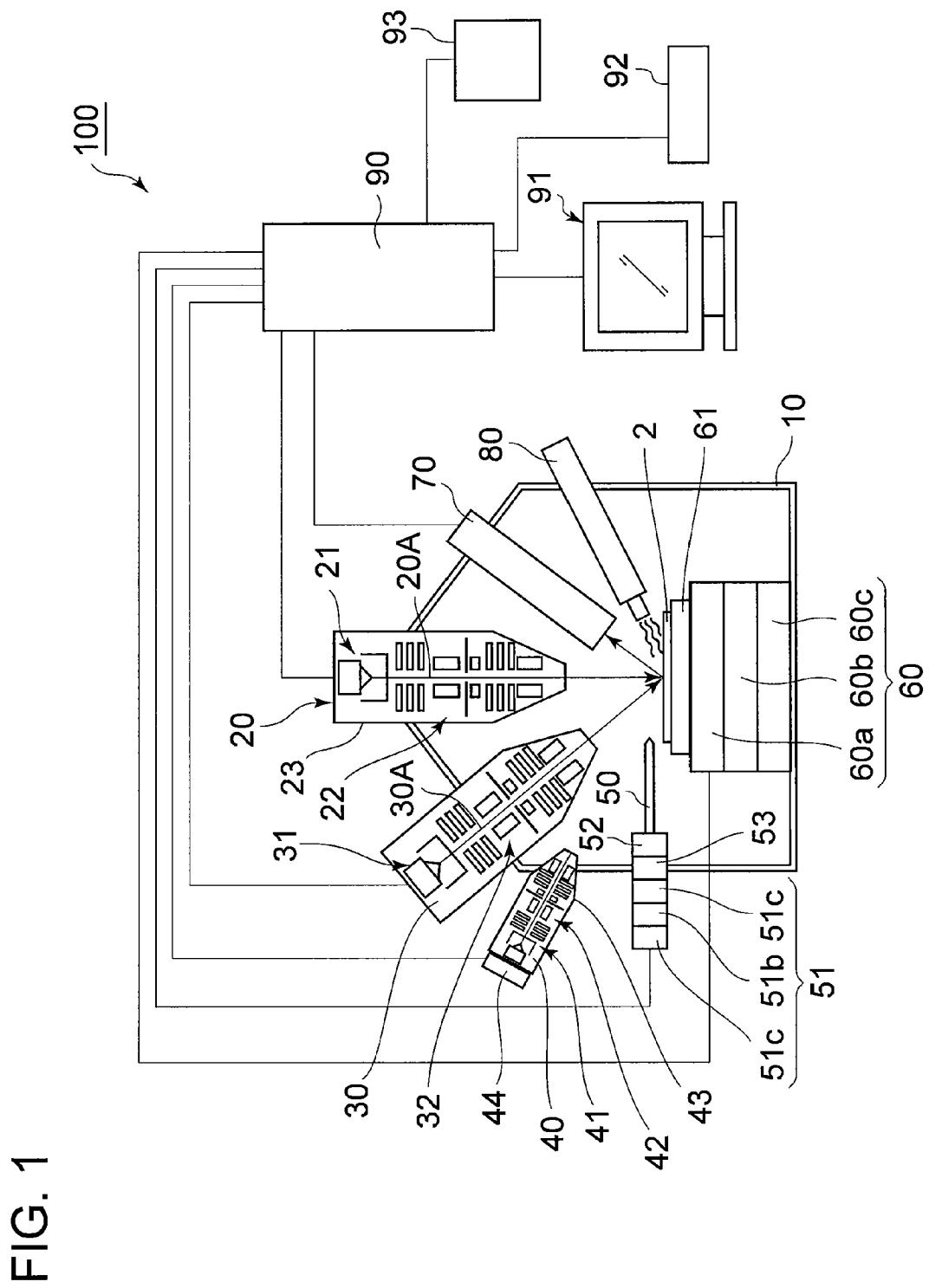
FIG. 1 is a block diagram showing an entire configuration of a focused ion beam apparatus according to an embodiment of the invention.

Referring now to the drawings, embodiments of the invention will be described.

FIG. 1 is a block diagram showing an entire configuration of a focused ion beam apparatus 100 according to an embodiment of the invention. In FIG. 1, the focused ion beam apparatus 100 includes a vacuum chamber 10, an ion beam irradiating system ("focused ion beam irradiating mechanism" in Claims) 20, an electron beam irradiating system 30, an argon ion beam irradiating system 40, a nanoforceps 50, a sample stage 60, a secondary charged electron detector ("detector" in Claims) 70, a gas gun 80, and a control unit 90. The interior of the vacuum chamber 10 is decompressed to a predetermined degree of vacuum, and part or all of components of the focused ion beam apparatus 100 are arranged in the vacuum chamber 10.

The sample stage 60 movably supports a sample table 61, and a sample 2 is placed on the sample table 61. Then, the sample stage 60 includes a moving mechanism which allows universal displacement of the sample stage 60. This moving mechanism includes an XYZ moving mechanism 60b configured to move the sample table 61 in parallel to the horizontal plane and along an X-axis and a Y-axis orthogonal to each other, and a Z-axis orthogonal to the X-axis and the Y-axis, a rotation mechanism 60c configured to cause the sample table 61 to rotate about the Z-axis, and a tilt mechanism 60a configured to rotate the sample table 61 about the X-axis (or Y-axis). The sample stage 60 moves the sample 2 to the position to be irradiated with an ion beam 20A by universally displaces the sample table 61.

The control unit 90 may include a CPU as a central processing unit, a storage unit (RAM and ROM) 93 configured to store data, programs, and the like, and a computer having an input port and an output port for inputting and outputting signals with respect to an external equipment. The control unit 90 controls respective components of the focused ion beam apparatus 100 by executing various types of processing by the CPU on the basis of the program stored in the storage unit 93. The control unit 90 is electrically connected to control wirings or the like of the ion beam (hereinafter, the focused ion beam is referred to simply as "ion beam" as needed) irradiating system 20, the electron beam irradiating system 30, the argon ion beam irradiating system 40, the nanoforceps 50, the secondary charged particle detector 70, and the sample stage 60.

The control unit 90 converts secondary charged particles detected by the secondary charged particle detector 70 into intensity signals and generates an image data showing a sample surface, and then generates a sample image on the basis of the image data. The sample image is outputted to a display device (display, "display unit" in Claims) 91 connected to the control unit 90, so that a processing area image, described later, can be specified on the display device 91.

The processing area image is stored in the storage unit 93 as the image data (bitmap data).

The control unit 90 is configured to drive the sample stage 60 on the basis of instructions of software or inputs by an operator, and adjust the position or the posture of the sample 2, thereby adjusting the position to be irradiated or the angle of irradiation of the ion beam 20A onto the surface of the sample 2. The control unit 90 is also adapted to drive a forceps stage 51 and a clamping mechanism 53 to adjust the position and the posture of the nanoforceps 50 thereby allowing holding of the sample 2 by the nanoforceps 50.

An input unit 92 such as a keyboard for acquiring input instruction from the operator is connected to the control unit 90.

Although detailed description will be given later, the control unit 90 sets the processing area image which indicates the position to be irradiated with the ion beam 20A on the sample image, drives the sample stage 60 according to the processing area image, sets the dose amount of the ion beam 20A according to the pixels included in the processing area image, so that a processing with the ion beam according to the processing area image is performed. The control unit 90 also has a function to perform an interpolating process on the processing area image when the processing area image is reduced or enlarged in scale (deformed). Depending on the necessity, the control unit 90 binarizes intensities of the pixels included in the processing area image.

The control unit 90 corresponds to "image generating unit", "processing area setting unit", "position of irradiation setting unit", "beam setting unit", "interpolating unit", and "binarizing unit" in Claims.

The ion beam irradiating system 20 includes an ion source 21 configured to generate ion, and an ion optical system 22 configured to form the ion flowed out from the ion source 21 into the focused ion beam and cause the same to perform scanning. The sample 2 on the sample stage 60 in the vacuum chamber 10 is irradiated with the ion beam 20A as a charged particle beam from the ion beam irradiating system 20 having an ion beam barrel 23. At this time, secondary charged particles such as secondary ion or secondary electron are generated from the sample 2. The secondary charged particles are detected by the secondary charged particle detector 70, so that the image of the sample 2 is acquired. The ion beam irradiating system 20 is able to etch the sample 2 within the range of irradiation by increasing the amount of irradiation of the ion beam 20A.

The ion optical system 22 includes, for example, a condenser lens configured to focus the ion beam 20A, an aperture configured to narrow the ion beam 20A, an aligner configured to adjust an optical axis of the ion beam 20A, an objective lens configured to focus the ion beam 20A onto the sample, and a deflector configured to scan the ion beam 20A on the sample.

The electron beam irradiating system 30 includes an electron source 31 configured to emit electrons, and an electron optical system 32 configured to form the emitted electrons from the electron source 31 into a beam-shape and perform scanning. By irradiating the sample 2 with an electron beam 30A emitted from the electron beam irradiating system 30, the secondary electrons are generated from the sample 2, and the generated secondary electrons are detected by the secondary charged particle detector 70 for acquiring the image of the sample 2. Here, the electron beam 30A emitted from an electron beam barrel 33 is irradiated on the sample 2 at the same position as the ion beam 20A.

As described above, according to the invention, since the sample image which indicates the sample surface is acquired, either the secondary charged particles (secondary ion or secondary particles) via the irradiation of the ion beam 20A or the secondary charged particles (secondary electrons) via the irradiation of the electron beam 30A may be employed. In the invention, the charged particle beam apparatus having no electron beam irradiating system 30 may be employed.

The argon ion beam irradiating system 40 includes an argon ion source 41, an argon ion optical system 42, and an argon ion beam barrel 43 and, in addition, a beam position control unit 44 configured to control the position to be irradiated with the argon ion beam. An argon ion beam for cleaning the sample 2 is irradiated from the argon ion beam irradiating system 40.

The secondary charged particle detector 70 detects the secondary charged particles (secondary electrons or secondary ion) generated from the sample 2 when the sample 2 is irradiated with the ion beam 20A or the electron beam 30A.

The gas gun 80 discharges predetermined gas such as etching gas to the sample 2. By irradiating the sample 2 with the ion beam 20A while supplying the etching gas from the gas gun 80, the speed of etching of the sample by the ion beam 20A may be increased. Also, by irradiating the sample 2 with the ion beam 20A while supplying compound gas from the gas gun 80, local precipitation (deposition) of the gas component is achieved in the vicinity of the area to be irradiated with the ion beam 20A.

Subsequently, the processes of setting and deforming of the processing area image, which is a characteristic point of the invention, will be described.

Figure 2:
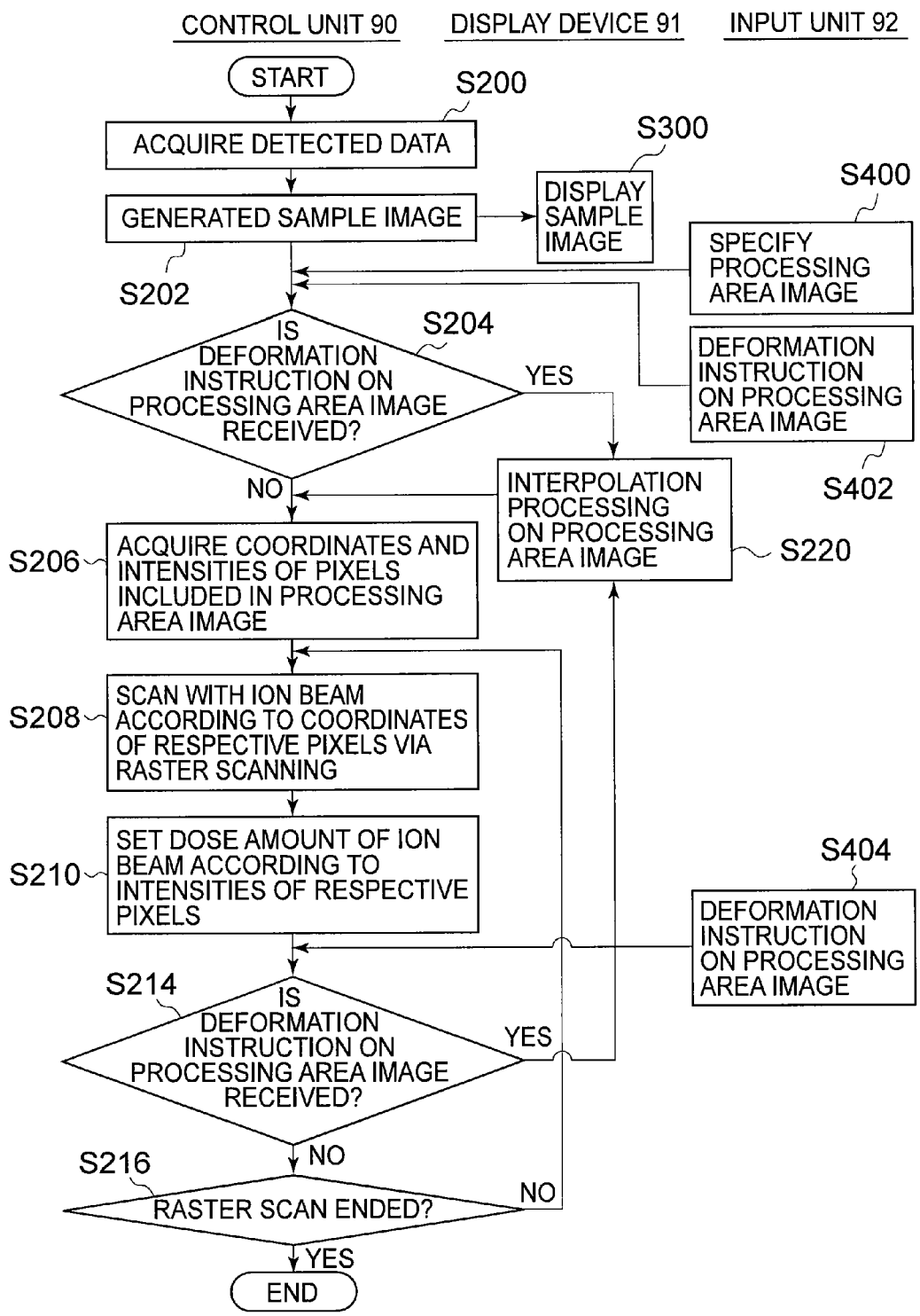
FIG. 2 is a drawing showing a flow of setting and deforming a processing area image, and a processing process with an ion beam.

FIG. 2 is a flow of setting and deforming the processing area image, and a processing process with the ion beam 20A. First of all, the control unit 90 acquires detected data on the secondary charged particle from the secondary charged particle detector 70 (Step S200), and generates the sample image indicating the surface shape of the sample 2 (Step S202). The control unit 90 sends the sample image to the display device 91, and the display device 91 displays the sample image (Step S300).

The operator specifies a corresponding processing area image at a position where the irradiation of the ion beam is desired on the sample image displayed on the display device 91, and the specification data is sent to the control unit 90 via the input unit 92 (Step S400).

The processing area image is stored in the storage unit 93 in advance as the image data (bitmap data), and the image data includes a plurality of the pixels. The intensities are determined on the pixel-to-pixel basis. Then, in the invention, the coordinate of the each pixel corresponds to the position to be irradiated with the ion beam, and the dose amounts of the ion beam (beam irradiating duration □ current) are set according to the intensities of the respective pixels. For example, the higher the intensity is, the larger the dose amount of the ion beam becomes, so that the deeper etching is achieved.

As described later, it is also possible to binarize the intensities on the respective pixels and set the irradiation of the ion beam to be turned ON and OFF according to the binarized values. In this case, it may be set in such a manner that the ion beams is not irradiated (etching is not performed) if the intensity of the pixel is smaller than a threshold value of the binarized value for example, and the ion beam is irradiated (etching is performed) if the intensity of the pixel is not smaller than the threshold value of the binarized value.

Subsequently, upon receipt of the specification data of the processing area image from the input unit 92 in Step S400, the control unit 90 further determines whether the deformation instruction on the processing area image is received from the input unit 92 or not in Step S402 (Step S204). This determination is made for determining whether the size of the processing area image specified once in Step S400 is deformed before the irradiation of the ion beam (processing) or not.

If the result of determination is "No" in Step S204, the control unit 90 acquires the coordinates and the intensities of the respective pixels on the sample image included in the processing area image (Step S206). In contrast, if the result of determination is "Yes" in Step S204, the control unit 90 performs the interpolating process on the processing area image described later (Step S220).

After having performed Step S206, the control unit 90 scans the ion beam 20A according to the coordinate of the each pixel via a raster scanning (Step S208). In the raster scanning, the control unit 90 sets the coordinates of the pixels of the processing area image present on scanning lines as the positions to be irradiated with the ion beam and controls the deflector so that the positions corresponding to the coordinates of the respective pixels are irradiated with the ion beam 20A. Furthermore, the control unit 90 sets the dose amounts of the ion beam according to the intensities of the pixels set in Step S208 (Step S210). More specifically, the control unit 90 controls the duration of beam irradiation and/or the current of the ion source 21 to control the dose amounts of the ion beam 20A to be irradiated and adjust the degree of processing with the ion beam (the etching depth or thickness of the deposition film) in Step S210.

In other words, the control unit 90 performs the processes in Step S208 and S210 every time when setting the coordinate of a single pixel via the raster scanning, and irradiates the surface of the sample 2 with the ion beam 20A by the predetermined amounts of dose according to the process in Step S210. As regards the ion beam irradiation via the raster scanning, the scan is repeated unless the result of determination is "Yes" in the subsequent step S214.

It is also possible to control the rotation mechanism 60c or the tilt mechanism 60a as needed in Step S208.

Subsequently, in Step S214, the control unit 90 determines whether the deformation instruction on the processing area image is received from the input unit 92 or not as in Step S204. If the result of determination is "No" in Step S214, the procedure goes to Step S216, and the control unit 90 determines whether the raster scanning is ended or not (whether the position of the final pixel of the last scanning line is read or not). The determination in Step S214 is made for determining whether the size of the processing area image is deformed during irradiation (during processing) of the ion beams.

If the result of determination is "No" in Step S216, the procedure goes to Step S210, and the processes S208 and S210 via the raster scanning are repeated. In contrast, if the result of determination in Step S216 is "Yes", the raster scanning is ended, and the entire process is ended.

Subsequently, if the result of determination is "Yes" in step 5204 and/or Step 214, the control unit 90 performs the interpolating process on the processing area image (Step S220). In this embodiment, a case in which the result of determination is "Yes" in Step S214, that is, a case in which the operator deforms the processing area image during the processing with the ion beam and receives the deformation instruction on the processing area image from the input unit 92 (Step S404) will be described.

Upon receipt of the deformation instruction on the processing area image in Step S404 ("Yes" in Step S214), the control unit 90 performs the interpolating process on the processing area image in Step S220. The processing area image is the image data (bitmap data) and the number of pixels increases and decreases by the deformation (reduction and enlargement in scale) and hence the image quality is deteriorated. The interpolating process is a process to prevent the image quality from being deteriorated when an original processing area image stored in the storage unit 93 in advance is reduced or enlarged in scale and, in the invention, any known interpolating processes may be applied. The known interpolating processes include, for example, a bi-linear method, a bi-cubic method, and a nearest neighbor method, and the invention is not limited thereto. However, the bi-linear method is preferably employed.

In this embodiment, the dose amounts of the ion beam are set according to the intensities of the pixels in Step 5210 as described above. Then, with the bi-linear method, for example, an average value of four pixels having close coordinates is employed before and after the reduction and enlargement in scale of the processing area image, and the changes in intensity are averaged. Therefore, since the change of the intensity is smoothened even when the image is reduced or enlarged in scale, the changes of the dose amounts (that is, the etching depth) of the ion beam according to the intensities are also reduced before and after the reduction and enlargement in scale, so that the processing which reproduces an original image is achieved. A case in which the processing area image is enlarged or reduced in one direction is also the same, whereby the aspect ratio of the processing area may be changed.

Subsequently, a display transition on the display unit 91 in association with the process in Steps 5202 to 5210 (provided that the result of determination is "No" in Step 5204) in FIG. 2 will be described with reference to FIG. 3 and FIG. 4.

Figure 3:
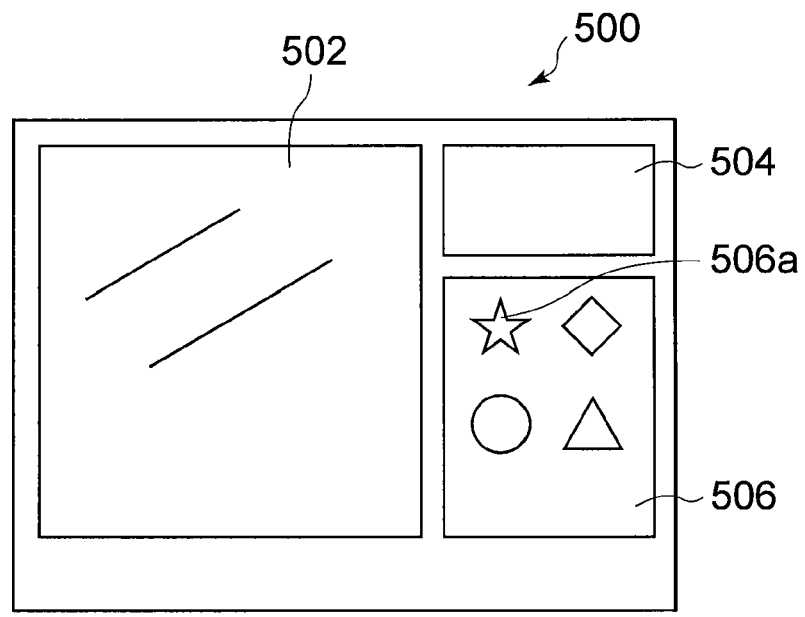
FIG. 3 is a drawing showing a display on a display device in association with the process from Steps S202 to S210.

FIG. 3 shows a display 500 on the display unit 91, and a sample image 502 generated in Step 5202 is displayed on the left side of the display 500. On the other hand, an instruction display 504 used by the operator for issuing instructions of various operations of the focused ion beam apparatus 100 is displayed on an upper right portion of the display 500. A list of processing area images 506 stored in the storage unit 93 in advance as the image data (bitmap data) are displayed in a lower right portion of the display 500 (only part of the processing area image is displayed in FIG. 2).

Figure 4:
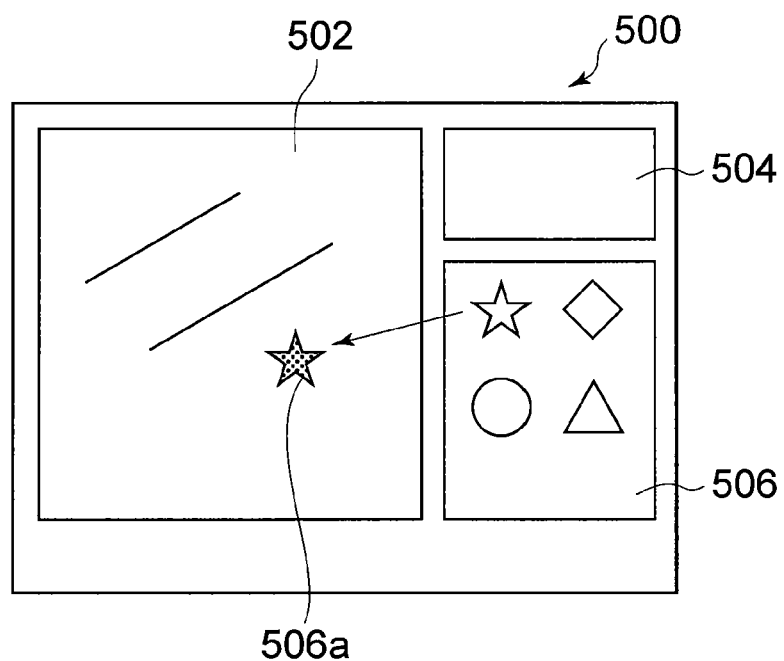
FIG. 4 is a drawing showing the display on the display device in association with the process from Steps S202 to S210.

In FIG. 3, the operator selects a star shape 506a as the processing area image 506, and specifies the star shape 506a on the sample image 502 as shown in FIG. 4 (corresponding to Step S400). This specification is achieved, for example, by selecting the star shape 506a on the processing area image 506, dragging the same with a pointing device such as a mouse, and dropping the same at a predetermined position on the sample image 502. In this example, the interior of the star shape 506a shown in FIG. 4 is etched.

Figure 5:
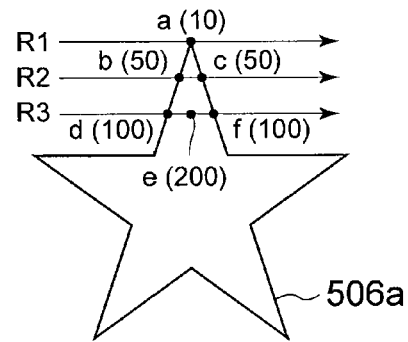
FIG. 5 is a drawing showing a method of irradiating with the ion beam via a raster scanning.

FIG. 5 shows a method of irradiating with the ion beam via the raster scanning in Steps S208 and S210 in FIG. 2. In FIG. 5, a pixel a of the processing area image (star shape) 506a is positioned on a scanning line R1. In the same manner, pixels b, c of the star shape 506a are positioned on a scanning line R2, and pixels d, e of the star shape 506a are positioned on a scanning line R3.

Numerals in parentheses of the respective pixels in FIG. 5 designate intensities. For example, the pixel a (10) indicates that the intensity of the pixel a is "10".

The raster scanning is performed along the scanning line R1, and the position corresponding to the pixel a is irradiated with the ion beam by the dose amount corresponding to the intensity 10. Subsequently, on the scanning line R2, the positions corresponding to the pixels b, c are irradiated with the ion beams by the dose amount corresponding to the intensity 50. Subsequently, on the scanning line R3, the positions corresponding respectively to the pixels d, e, f are irradiated with the ion beams by the dose amount corresponding to the intensities 100, 200, and 100, respectively.

In other words, in this example, the intensity is increased from distal ends toward the center of the star shape 506a, and the etching depth is also increased correspondingly.

Figure 6:
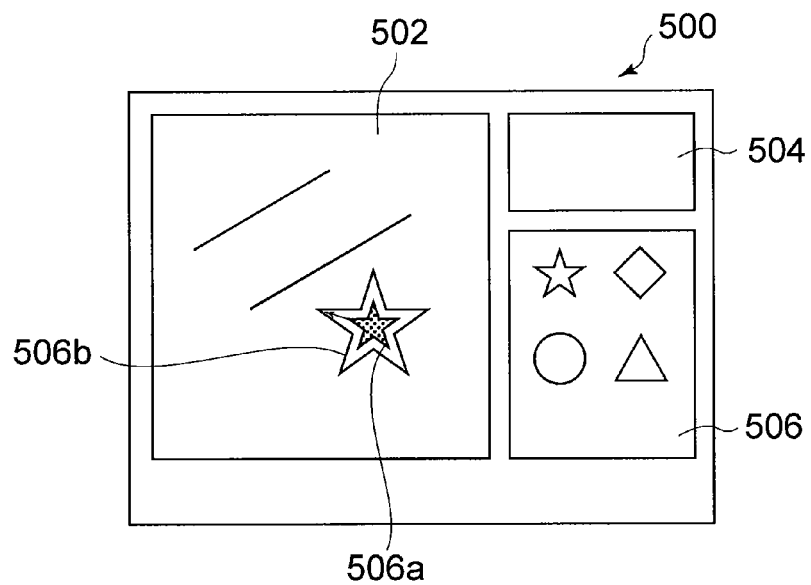
FIG. 6 is a drawing showing the display on the display device in an interpolating process.

Subsequently, the display transition on the display unit 91 in the interpolating process in Steps S404 to S214 in FIG. 2 will be described with reference to FIG. 6.

When the operator deforms (enlarges) the processing area image (star shape) 506a on the sample image 502 on the display unit 91, an enlarged image 506b is displayed on the sample image 502, and this deformation instruction is sent to the control unit 90 via the input unit 92 (Step S404). This deformation instruction is achieved, for example, by selecting the star shape 506a on the sample image 502, dragging the same with the pointing device such as the mouse, and enlarging and dropping the image.

The control unit 90 compares the coordinates of the enlarged image 506b on the sample image 502 with the coordinates of the original star shape 506a on the sample image 502, calculates the enlarged ratio of the star shape 506a in the vertical and horizontal directions, then performs the known interpolating process, and then sets the coordinates and the intensities of the pixels of the enlarged image 506b.

Figure 7:
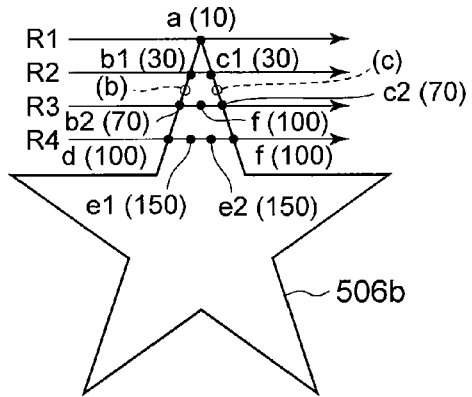
FIG. 7 is a drawing showing the method of irradiating with the ion beam via the raster scanning after the interpolating process.

FIG. 7 shows a method of irradiating with the ion beam via the raster scanning after the interpolating process. In the enlarged image 506b, the number of scanning lines is increased in comparison with the original image 506a (R1 to R4). Then, a pixel b1 is interpolated between the original pixels a and b by the interpolating process, and a pixel c1 is interpolated between the original pixels a and c. In the same manner, pixels b2, c2, e1, e2, f are interpolated as well.

Then, the interpolating process is performed so that, for example, the intensity of the pixel b1 takes a value between the intensities of the original pixel a (10) and b (50). Therefore, the changes in intensities of the pixels are also smoothens, and hence the changes in degree of processing are also smoothened when processing with the ion beam is performed according to the intensities, so that the processing in which the original image is reproduced is achieved even when the processing area image is deformed. For example, in this example, the processing which increases the depth from the distal ends toward the center of the star shape is performed on the star shape 506a. Then, in the enlarged image 506b as well, the changes in intensities from the distal ends toward the center of the star shape are smoothened, and the processing which increases the depth from the distal ends toward the center of the star shape like the original image 506a is reproduced.

The invention is not limited to the embodiment shown above and, needless to say, the invention covers various modifications and equivalents included in the spirit and scope of the invention.

For example, in the embodiment described above, the dose amounts of the ion beam are changed continuously according to the intensities of the pixels of the processing area image, and the etching depths are changed continuously. However, the intensities of the respective pixels may be binarized. In this case, the control unit 90 may binarize the intensities of the respective pixels read in Step S206 in FIG. 2, and turn the irradiation of the focused ion beam ON and OFF according to the threshold value of the binarized values of the intensity without setting the dose amounts in Step 5210. More specifically, the inside the star shape 506a is irradiated with the focused ion beam by a certain dose amount because the pixels positioned inside the star shape 506a exceeds the threshold value of the intensity, and the irradiation of the ion beam is turned OFF for the pixels outside the star shape 506a because the intensities are not higher than the threshold value.

When the intensities of the respective pixels are binarized, the dose amount of the ion beam becomes constant and the etching depth also becomes constant. However, the load of processing of the control unit 90 is alleviated, and the processing speed is increased. In contrast, when the dose amounts of the ion beam are continuously changed according to the intensities of the pixels, the etching depth can be changed continuously, and hence processing of an oblique cross section or fabrication of a convex lens is easily achieved.

In the invention, when the processing area (area to be irradiated) is changed during the irradiation of the ion beams as the process in Step 5214 in FIG. 2, pits having different diameter in the direction vertical to the direction of irradiation of the ion beam (in the case of etching) or the deposits (in the case of deposition) having different diameters may be formed.

In the embodiment described above, the scanning with the ion beam 20A is performed according to the coordinates of the respective pixels via the raster scanning in Step 5208. However, the ion beam 20A may be irradiated via a vector scanning. When employing the vector scanning, the control unit 90 reads the coordinates of the pixels of the processing area image without limiting the scanning direction, and the respective coordinates are set as the positions to be irradiated with the ion beam. Then, the deflector is controlled so that the respective coordinates of the individual pixels are irradiated with the ion beam 20A.

What is claimed is:

1. A focused ion beam apparatus comprising:
    a sample stage configured to place a sample thereon and provided with a moving mechanism configured to move the position of the sample;
    a focused ion beam irradiating mechanism configured to irradiate the sample with a focused ion beam;
    a detector configured to detect a secondary charged particle generated from the sample when being irradiated with the focused ion beam or other electron beams;
    an image generating unit configured to generate an sample image of the sample on the basis of the detected data detected by the detector;
    a display unit configured to display the sample image;
    a processing area setting unit configured to set a processing area image including a plurality of pixels corresponding to positions to be irradiated with the focused ion beam on the sample image displayed on the display unit;
    a position of irradiation setting unit configured to set coordinates of the pixels included in the processing area image as the position to be irradiated on the sample;
    a beam setting unit configured to set a dose amount of the focused ion beam irradiated from the focused ion beam irradiating mechanism according to intensities predetermined on the pixel-to-pixel basis; and
    an interpolating unit configured to perform an interpolating process on the processing area image when the processing area image is deformed by the processing area setting unit.

2. The focused ion beam apparatus according to claim 1, comprising a binarizing unit configured to binarize the intensities of the respective pixels,
    wherein the beam setting unit irradiates the focused ion beam by a constant dose amount, or does not irradiate the focused ion beam according to the binarized intensities.

3. The focused ion beam apparatus according to claim 1, wherein the processing of the sample by the irradiation of the focused ion beam is etching of the sample or deposition on the sample.

4. A method of processing a sample by irradiating the sample with a focused ion beam using a focused ion beam apparatus comprising:
    setting a processing area image including a plurality of pixels corresponding to positions to be irradiated with the focused ion beam on the sample image of the sample;
    setting coordinates of the pixels included in the processing area image as the position to be irradiated on the sample;
    setting a dose amount of the focused ion beam irradiated from the focused ion beam irradiating mechanism according to intensities predetermined on the pixel-to-pixel basis; and
    performing an interpolating process on the processing area image when the processing area image is deformed.

5. The method of processing the sample using the focused ion beam apparatus according to claim 4, comprising: binarizing the intensities of the respective pixels,
    wherein the beam setting unit irradiates the focused ion beam by a constant dose amount, or does not irradiate the focused ion beam according to the binarized intensities when setting the dose amount.

6. The method of processing the sample using the focused ion beam apparatus according to claim 4, wherein the processing of the sample via the irradiation of the focused ion beam is etching of the sample or deposition on the sample.

7. A computer program stored on a memory configured to perform a processing by irradiating a sample with a focused ion beam using a focused ion beam apparatus, the computer program causing a computer to execute a process comprising:
    setting a processing area image including a plurality of pixels corresponding to positions to be irradiated with the focused ion beam on the sample image;
    setting coordinates of the pixels included in the processing area image as the position to be irradiated on the sample;

setting a dose amount of the focused ion beam irradiated from the focused ion beam irradiating mechanism according to intensities predetermined on the pixel-to-pixel basis; and performing an interpolating process on the processing area image when the processing area image is deformed by the processing area setting unit.

* * * * *